(12) United States Patent
Mouli et al.

(10) Patent No.: US 7,187,018 B2
(45) Date of Patent: Mar. 6, 2007

(54) REDUCED BARRIER PHOTODIODE/TRANSFER GATE DEVICE STRUCTURE OF HIGH EFFICIENCY CHARGE TRANSFER AND REDUCED LAG AND METHOD OF FORMATION

(75) Inventors: Chandra Mouli, Boise, ID (US); Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 256 days.

(21) Appl. No.: 10/602,721

(22) Filed: Jun. 25, 2003

(65) Prior Publication Data

US 2004/0262609 A1 Dec. 30, 2004

(51) Int. Cl.
*H01L 29/74* (2006.01)
(52) U.S. Cl. .................. 257/222; 257/225; 257/330
(58) Field of Classification Search ............. 257/222, 257/225, 328–330, 332; 438/48, 49, 54, 438/259, 270, 271, 589
See application file for complete search history.

(56) References Cited

U.S. PATENT DOCUMENTS

| | | | | |
|---|---|---|---|---|
| 4,760,273 A | * | 7/1988 | Kimata | 250/208.1 |
| 5,010,386 A | * | 4/1991 | Groover, III | 257/369 |
| 5,055,900 A | * | 10/1991 | Fossum et al. | 257/243 |
| 5,223,726 A | * | 6/1993 | Yamada et al. | 257/244 |
| 5,488,010 A | * | 1/1996 | Wong | 438/75 |
| 5,880,495 A | * | 3/1999 | Chen | 257/233 |
| 5,892,253 A | * | 4/1999 | Merrill | 257/292 |
| 6,441,412 B2 | * | 8/2002 | Oh et al. | 257/292 |
| 6,489,643 B1 | * | 12/2002 | Lee et al. | 257/292 |
| 6,504,195 B2 | * | 1/2003 | Guidash | 257/292 |
| 6,545,302 B2 | * | 4/2003 | Han | 257/222 |
| 6,639,293 B2 | * | 10/2003 | Furumiya et al. | 257/462 |
| 6,661,459 B1 | * | 12/2003 | Koizumi et al. | 348/310 |
| 6,744,084 B2 | * | 6/2004 | Fossum | 257/292 |
| 6,767,312 B2 | * | 7/2004 | Shim | 438/59 |
| 2002/0009822 A1 | | 1/2002 | Park | |

FOREIGN PATENT DOCUMENTS

| | | | | |
|---|---|---|---|---|
| JP | 61174765 A | * | 8/1986 | |
| JP | 03133173 A | * | 6/1991 | |
| JP | 04127468 A | * | 4/1992 | |

* cited by examiner

*Primary Examiner*—Eugene Lee
(74) *Attorney, Agent, or Firm*—Dickstein Shapiro Morin & Oshinsky LLP

(57) ABSTRACT

A pixel cell having a reduced potential barrier near a region where a gate and a photodiode are in close proximity to one another, and a method for forming the same are disclosed. Embodiments of the invention provide a pixel cell comprising a substrate. A gate of a transistor is formed at least partially below the surface of the substrate and a photodiode is adjacent to the gate. The photodiode comprises a doped surface layer of a first conductivity type, and a doped region of a second conductivity type underlying the doped surface layer. The doped surface layer is at least partially above a level of the bottom of the gate.

42 Claims, 8 Drawing Sheets

REDUCED BARRIER PHOTODIODE/TRANSFER GATE DEVICE STRUCTURE OF HIGH EFFICIENCY CHARGE TRANSFER AND REDUCED LAG AND METHOD OF FORMATION

FIELD OF THE INVENTION

The present invention relates to the field of semiconductor devices, particularly to an improved pixel cell for high efficiency charge transfer and reduced lag.

BACKGROUND OF THE INVENTION

CMOS imagers are increasingly being used as low cost imaging devices. A CMOS image sensor circuit includes a focal plane array of pixel cells, each one of the cells includes a photogate, photoconductor, or photodiode having an associated a charge accumulation region within a substrate for accumulating photo-generated charge. Each pixel cell may include a transistor for transferring charge from the charge accumulation region to a sensing node, and a transistor, for resetting a sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046–2050 (1996); and Mendis et al., "CMOS Active Pixel Image Sensors," IEEE Transactions on Electron Devices, Vol. 41(3), pp. 452–453 (1994). See also U.S. Pat. Nos. 6,177,333 and 6,204,524, which describe operation of conventional CMOS image sensors, the contents of which are incorporated herein by reference.

A schematic top view of a portion of a semiconductor wafer fragment containing one exemplary CMOS pixel cell is shown in FIG. 1. The CMOS pixel cell 10 is a four transistor (4T) cell. The CMOS pixel cell 10 generally comprises a charge collection region 21 for collecting charges generated by light incident on the pixel, and a transfer gate 50 for transferring photoelectric charges from the collection region 21 to a sensing node, typically a floating diffusion region 25. The floating diffusion region 25 is electrically connected to the gate 60 of an output source follower transistor. The pixel cell 10 also includes a reset transistor having a gate 40 for resetting the floating diffusion region 25 to a predetermined voltage before sensing a signal; and a row select transistor 80 for outputting a signal from the source follower transistor 60 to an output terminal in response to an address signal.

FIG. 2 is a diagrammatic side sectional view of the pixel cell 10 of FIG. 1 taken along line A–A'. As shown in FIG. 2, the exemplary CMOS pixel cell 10 has a pinned photodiode as the charge collection region 21. Pinned photodiode 21 is termed such since the potential in the photodiode is pinned to a constant value when the photodiode is filly depleted. The pinned photodiode 21 is adjacent to the gate 50 of a transfer transistor. There is a transfer gate/pinned photodiode overlap region 30, where the pinned photodiode 21 and the transfer gate 50 are in close proximity to one another. Additionally, the pinned photodiode 21 has a p-n-p construction comprising a p-type surface layer 24 and an n-type photodiode region 26 within a p-type active layer 20.

In the CMOS pixel cell 10 depicted in FIGS. 1 and 2, electrons are generated by light incident externally and stored in the n-type photodiode region 26. These charges are transferred to the floating diffusion region 25 by the gate 50 of the transfer transistor. The source follower transistor produces an output signal from the transferred charges. A maximum output signal is proportional to the number of electrons extracted from the n-type photodiode region 26.

In conventional CMOS pixel cells having pinned photodiode's, such as pinned photodiode 21, potential barriers may exist near a transfer gate/pinned photodiode overlap region 30, where the transfer gate 50 and the pinned photodiode 21 are in close proximity. FIG. 3 shows a graph representing a potential profile along a cutline L–L' from the pinned photodiode 21 to the transfer gate 50 in CMOS pixel cell 10. The potential profile shown in FIG. 3 is the potential profile that an electron may encounter as it is transported from the pinned photodiode 21 to the floating diffusion region 25.

An example of a potential barrier 31 which may exist near the transfer gate/pinned photodiode overlap region 30 is shown in FIG. 3. This potential barrier is influenced by several factors, the most important of which are: 1) pinned photodiode 21 donor implant levels, 2) pinned photodiode 21 surface acceptor implant levels, 3) transfer gate 50 threshold voltage adjust implant levels, 4) background p-well concentration, and 5) transfer gate 50 oxide thickness.

The existence of a potential barrier near the overlap region 30 is a problem in CMOS image sensors, particularly for low voltage sensors. The potential barrier results in incomplete charge transfer from the photodiode 21 causing image lag and reduced charge transfer efficiency. Previous methods to reduce this potential barrier have resulted in degraded sub-threshold leakage current for the transfer transistor. It is difficult to optimize both the potential barrier and sub-threshold leakage current for the transfer transistor in CMOS image sensors.

Accordingly, what is desired is a CMOS pixel cell having a reduced potential barrier in an area where a photodiode and a transfer gate structure are in close proximity to one another without increased transfer gate leakage or increased dark current.

BRIEF SUMMARY OF THE INVENTION

Embodiments of the invention provide a pixel cell having a reduced potential barrier in a region where a gate and photodiode are in close proximity to one another, and a method for forming the same. In one embodiment, the invention provides a pixel cell comprising a substrate. A gate of a transistor is formed at least partially below a surface of the substrate and a photodiode is adjacent to the gate. The photodiode comprises a doped surface layer of a first conductivity type, and a doped region of a second conductivity type underlying the doped surface layer. The doped surface layer is at least partially above a level of the bottom of the gate.

According to embodiments of the invention, the gate affects the doped surface layer of the photodiode at least partially through a sidewall of the gate to reduce a potential barrier in a region where the gate and photodiode are in close proximity to one another. These and other features of the invention will be more apparent from the following detailed description that is provided in connection with the accompanying drawings.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

Figure 1:
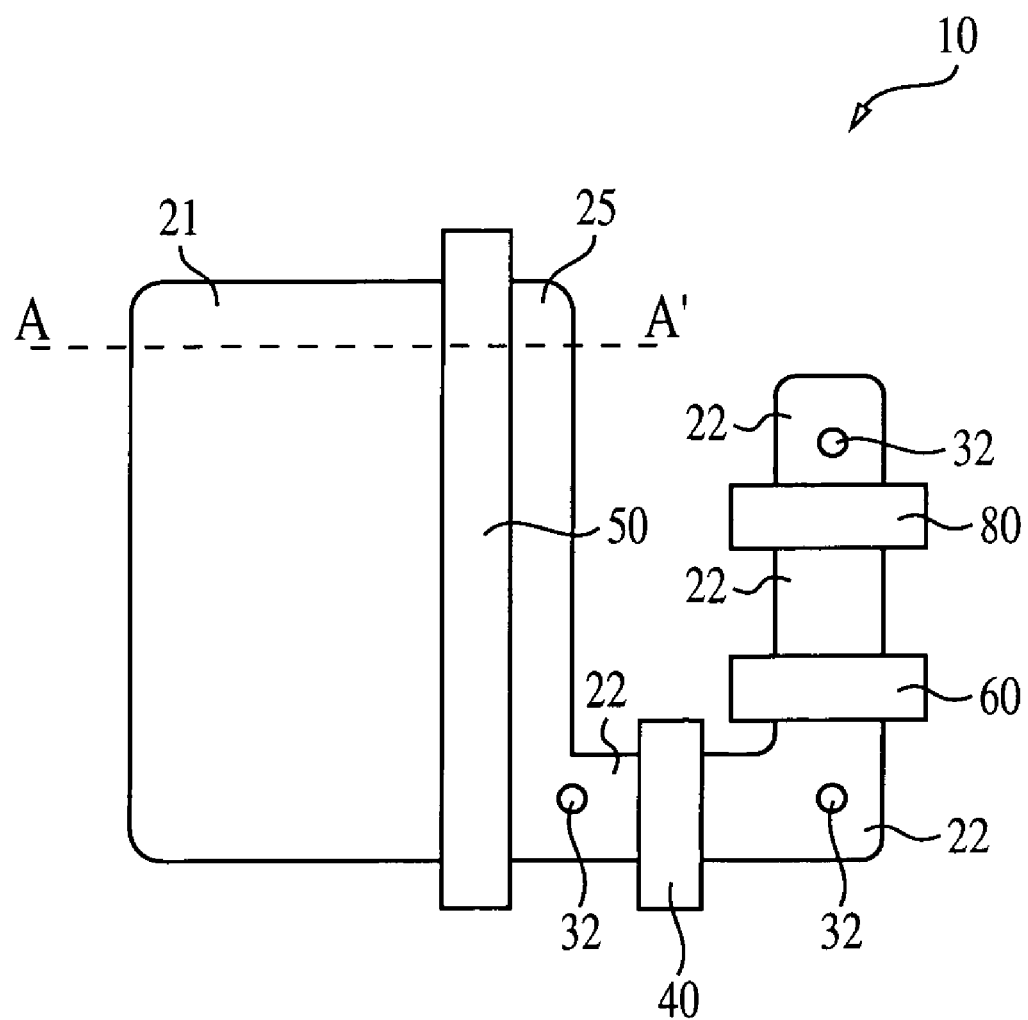
FIG. 1 is a top plan view of an exemplary conventional CMOS pixel cell.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photo-conversion device and transistors for converting electromagnetic radiation to an electrical signal. For purposes of illustration, a representative pixel is illustrated in the figures and description herein, and typically fabrication of all pixels in an image sensor will proceed simultaneously in a similar fashion.

Figure 2:
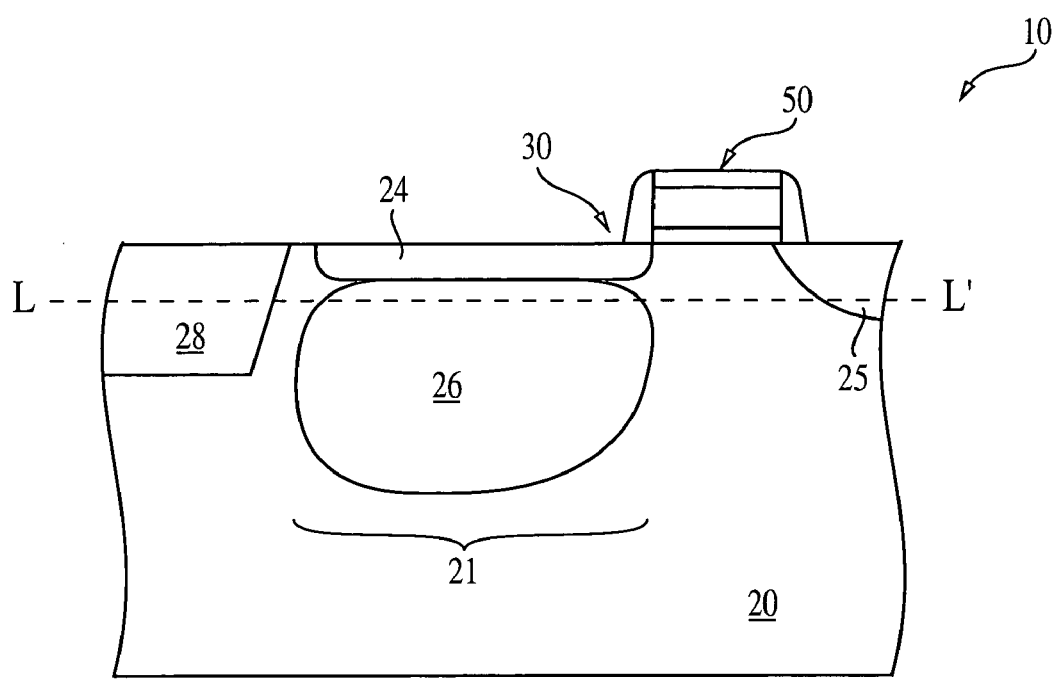
FIG. 2 is a diagrammatic side sectional view of the FIG. 1 pixel cell taken along line A–A'.
Figure 3:
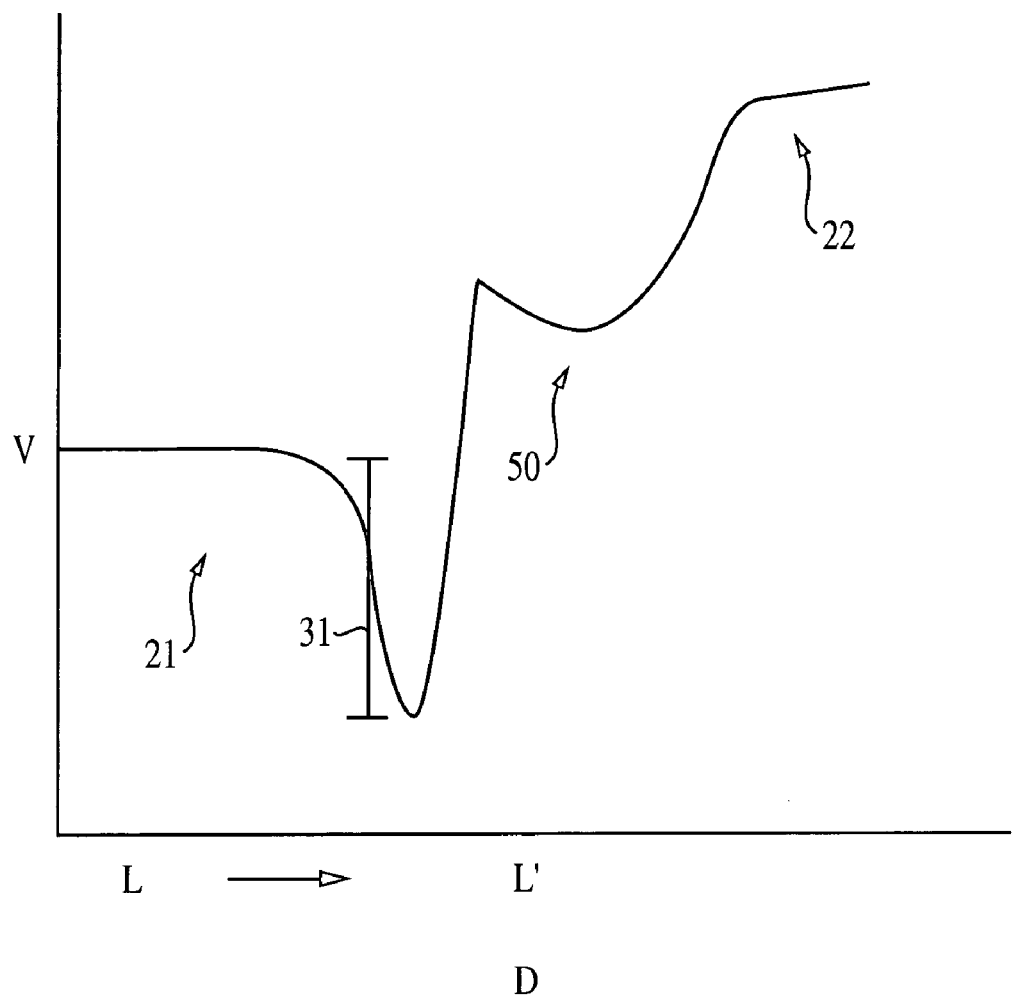
FIG. 3 is a graph representing the potential profile of the FIG. 2 pixel cell along a cutline L–L'.
Figure 4:
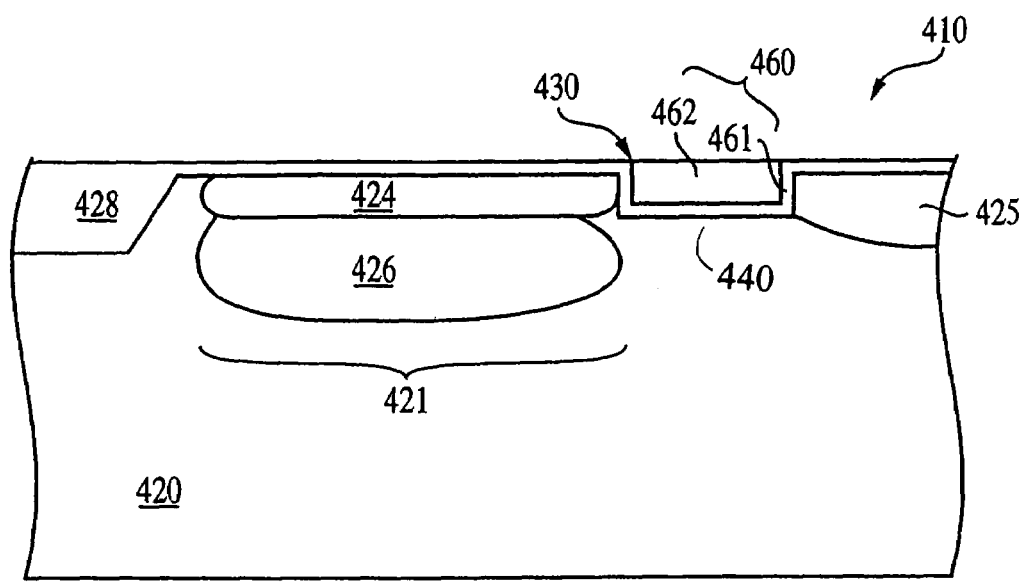
FIG. 4 is a diagrammatic side sectional view of a pixel cell according to a first embodiment of the invention.

Referring now to the drawings, FIG. 4 illustrates a first exemplary embodiment of a pixel sensor cell 410 along a side sectional view, which is similar to the view shown in FIG. 2. The pixel cell 410 has a gate 460 of a transistor, which for exemplary purposes is a transfer gate of a transfer transistor. The gate 460 comprises a conductive layer 462 over an oxide layer 461.

Adjacent to gate 460 is a pnp photodiode 421 formed in a p-type substrate 420. In this example, photodiode 421 is a pinned photodiode (pinned photodiode). The pinned photodiode 421 has a photodiode region 426 of a second conductivity type, which is preferably n-type. Above the n-type photodiode region 426 is a doped surface layer 424 of a first conductivity type, which is preferably p-type.

The doped surface layer 424 is adjacent to, and at a level that is approximately even with the level of, the transfer gate 460. Therefore, a region 430 where the transfer gate and pinned photodiode are in close proximity to one another (transfer gate/pinned photodiode region 430), includes a sidewall of transfer gate 460. As shown in FIG. 4, the transfer gate 460 is formed at least partially buried, such that it is at least partially below the surface of the substrate 420. Specifically, in this example, transfer gate 460 is formed in a trench in the substrate 420. Although the gate 460 is shown completely buried, such that a top surface of the gate 460 is even with or below a level of a top surface of the substrate 420, the gate 460 may also partially extend above the top surface of the substrate 420.

Adjacent to the transfer gate 460 and opposite to the pinned photodiode 421 is a floating diffusion region 425 for receiving charge transferred from the n-type photodiode region 426. Below the transfer gate 460 is a channel region 440 through which the current flows between the photodiode region 426 and the floating diffusion region 425. Also shown in FIG. 4 is an isolation region 428 adjacent to the pinned photodiode 421 on the side thereof opposite to the transfer gate 460.

The doped surface layer 424 is spaced close to the transfer gate 460, such that the operation of the transfer gate 460 affects the doped surface layer 424. Operation of the transfer gate 460 affects the p+ surface layer 424 through a sidewall of the transfer gate 460 adjacent to the pinned photodiode 421. When the transfer gate 460 is pulled positive, the p+ surface layer 424 is more strongly inverted than in a conventional pixel cell 10 (FIG. 2), minimizing the potential barrier near the transfer gate/pinned photodiode region 430. The reduced potential barrier in the transfer gate/pinned photodiode region 430 serves to improve charge transfer, image lag, fill factor, and quantum efficiency of the pixel cell 410.

Additionally, as compared to a conventional pixel cell 10 (FIG. 2), there is a larger area of the oxide layer 461 adjacent to both the pinned photodiode 421 and floating diffusion region 425, which helps to reduce the gate induced drain leakage (GIDL). Further, the distance of the pinned photodiode 421 from an overlying microlens (not shown) may be desirably reduced since the gate 460 is at least partially buried and overlying structures, including the microlens, may be closer to the pinned photodiode 421 than in a conventional pixel cell 10 (FIG. 2).

The processes for fabricating the pixel cell 410 illustrated in FIG. 4 will be described with reference to FIGS. 5A–5E.

Figure 5A:
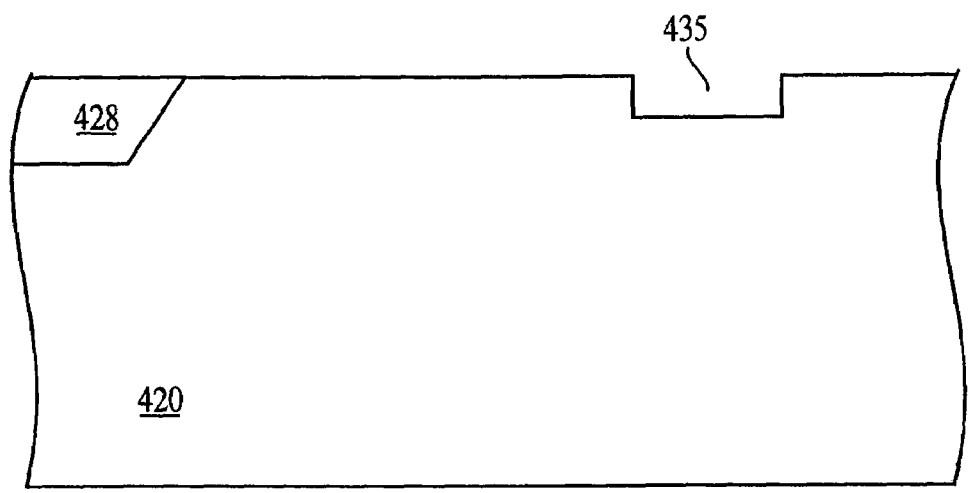
FIG. 5A is a diagrammatic side sectional view of the pixel cell of FIG. 4 at an initial stage of processing.

FIG. 5A illustrates a substrate 420. For exemplary purposes the substrate 420 is a silicon substrate slightly doped with a dopant of a first conductivity type, which for exemplary purposes is p-type. As noted above, however, the invention has application to other semiconductor substrates.

FIG. 5A also illustrates an isolation region 428, which is formed within the substrate 420 and filled with a dielectric material, which may be an oxide material, for example a silicon oxide, such as SiO or $SiO_2$; oxynitride; a nitride material, such as silicon nitride; silicon carbide; a high temperature polymer; or other suitable dielectric material. Preferably, as shown in FIG. 5A, the isolation region 428 is a shallow trench isolation (STI) region 428 and the dielectric material is a high density plasma (HDP) oxide, a material which has a high ability to effectively fill narrow trenches. The depth of the STI region 428 is within the range of approximately 1000 to 5000 Angstroms (Å), and preferably is within the range of approximately 2000 to 3500 Å.

Before or after the formation of the STI region 428, a trench 435 is formed in the substrate 420. A mask level is used for patterning, and trench 435 is formed in the substrate 420 where a gate of a transfer transistor is to be formed. Preferably, the trench 435 is within the range of approximately 500 to 2500 Å deep. Also, the trench 435 may be formed larger than the desired size of a gate 460 (FIG. 4) of a transfer transistor to prevent misalignment of the gate 460 to the trench 435 during the formation of the gate 460 described below.

Subsequently, a gate structure 460 of a transfer transistor is formed in the trench 435. As described below, a damascene process may be used. Other known techniques, however, may also be used to form a gate of a transfer transistor. Therefore, the process described below is exemplary, and not limiting. Depending on the techniques used, the process may be modified as necessary or desired to achieve the invention.

Figure 5B:
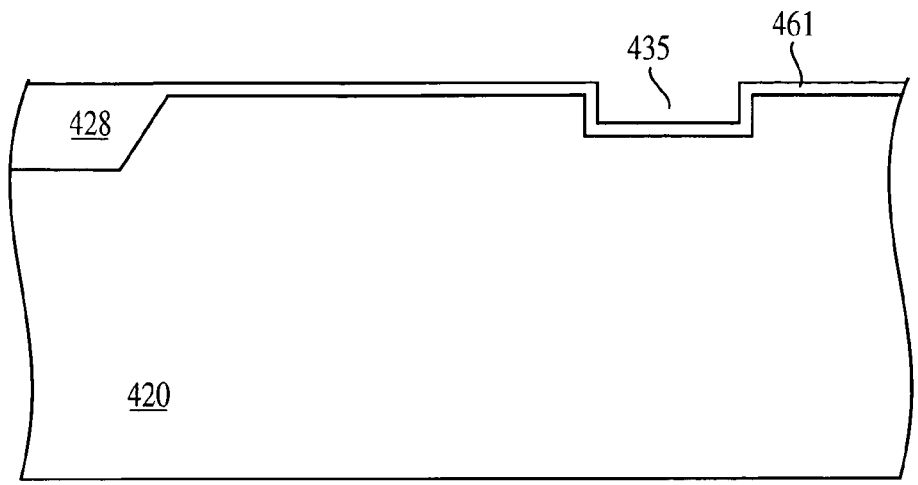
FIG. 5B is a diagrammatic side sectional view of the pixel cell of FIG. 4 at an intermediate stage of processing.

Referring to FIG. 5B, an oxide layer 461 is formed over the surface of the substrate 420 and on the sidewalls and bottom surface of the trench 435. The portion of the oxide layer 461 on the sidewalls and bottom surface of the trench 435 serve as a gate oxide layer. The oxide layer 461 may be formed by, for example, a dry/wet/dry oxidation process. Preferably, the oxide layer 461 has a thickness of approximately 20 to 100 Å. More specifically, the oxide layer 461 is approximately 30 to 70 Å thick. The oxide layer 461 will be slightly thicker on the sidewalls of the trench 435 than on the bottom surface of trench 435 because the oxide is grown on the different silicon crystallographic planes. Alternatively, the oxide layer 461 may be an oxy-nitride layer, or a deposited layer of high-k dielectric material, including, but not limited to hafnium oxide, zirconium oxide, tantalum oxide, or aluminum oxide, formed by chemical vapor deposition (CVD), atomic layer deposition (ALD), or other methods of the art.

Optionally, prior to the formation of the oxide layer 461, a sacrificial oxide layer (not shown) may be formed on the sidewalls and bottom surface of the trench 435 and then stripped to better ensure the formation of an oxide layer 461 of sufficient quality.

Figure 5C:
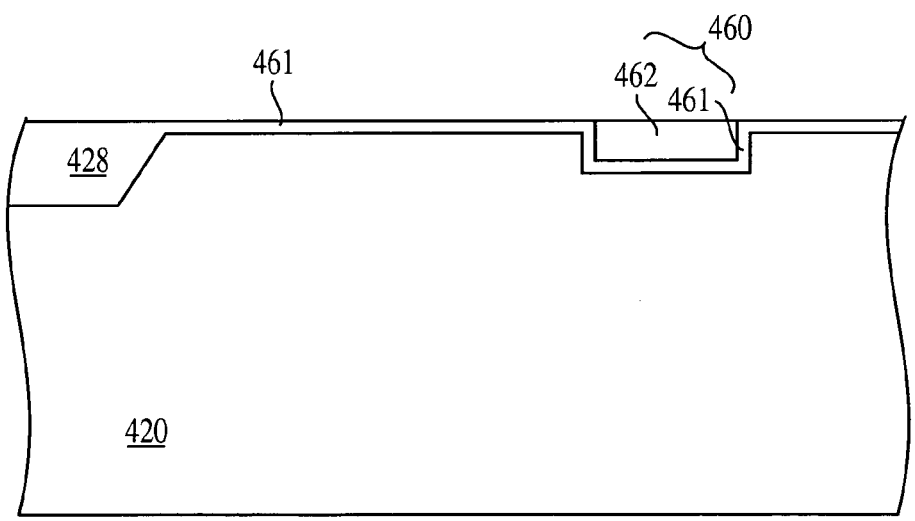
FIG. 5C is a diagrammatic side sectional view of the pixel cell of FIG. 4 at an intermediate stage of processing.

Referring to FIG. 5C, a conductive layer of doped polysilicon 462, or other suitable conductive material, is deposited in the trench 435 over the oxide layer 461 by CVD or other methods of the art. As noted above, to prevent misalignment of the polysilicon layer 462 to the trench 435, the trench 435 may be formed larger than the patterned length of the polysilicon layer 462.

Additionally, a silicide layer (not shown) may be formed over the polysilicon layer 462. The silicide layer may be included in all of the transistor gate structures in an imager circuit and may be titanium silicide, tungsten silicide, cobalt silicide, molybdenum silicide, or tantalum silicide. This additional conductive layer may also be a barrier layer/refractor metal, such as TiN/W or $W/N_x/W$, or it could be formed entirely of $WN_x$.

A chemical mechanical polish (CMP) step is then conducted to planarize the substrate 420 surface.

As noted above, alternative methods of forming the gate 460 may be employed. Accordingly, the gate 460 may instead be partially buried. In this manner, only part of the gate 460 may be in the trench 435 and below the surface of the substrate 420. In such a case, a CMP step would not be conducted, and a portion of the polysilicon layer 462 would remain above the surface of the substrate 420 and may be subsequently processed as desired by conventional methods. For simplicity, however, the gate 460 is shown completely buried.

Figure 5D:
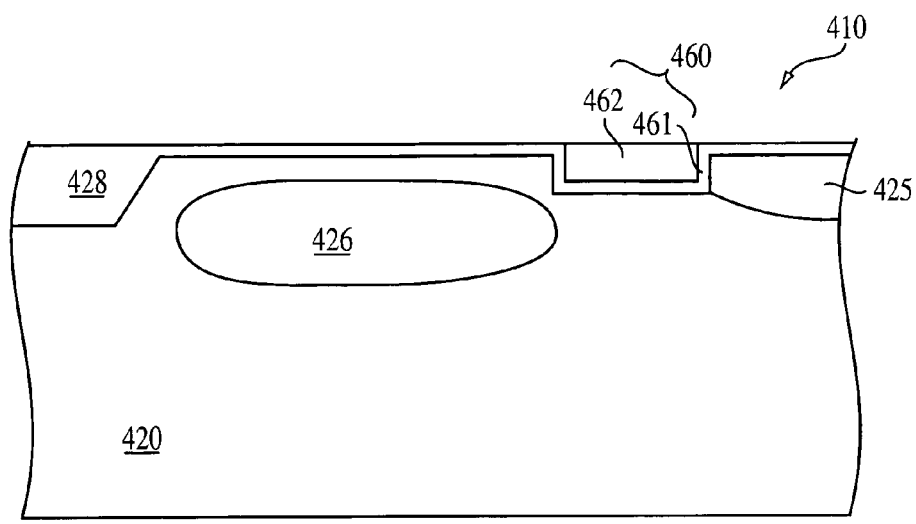
FIG. 5D is a diagrammatic side sectional view of the pixel cell of FIG. 4 at an intermediate stage of processing.

Referring to FIG. 5D, a floating diffusion region 425 is then formed by known methods, preferably as a doped region of n-type conductivity in the substrate 420 adjacent to the gate 460 and on an opposite side of the gate 460 from where the photodiode 421 is to be formed. The floating diffusion region 425 is formed such that it is adjacent to the gate 460 at least partially through a sidewall of the gate 460. In this manner, the surface of the floating diffusion region 425 is above the level of the bottom of the transfer gate 460 (or bottom of the trench 435).

A photodiode region 426 of a second conductivity type is also formed in the substrate 420. Preferably the photodiode region 426 is a lightly doped n– region 426. The n– region 426 may be formed by methods known in the art. For example, a mask of photoresist (not shown) may be patterned over the substrate having an opening over the surface of the substrate where the n– region 426 is to be formed. An n-type dopant, such as phosphorus, arsenic, or antimony is implanted through the opening and into the substrate 420. Multiple implants may be used to tailor the profile of the n– region 426. If desired, an angled implantation may be conducted to form the n– region 426, such that implantation is carried out at angles other than 90 degrees relative to the surface of the substrate 420.

The n– region 426 is approximately aligned with an edge of the gate 460, but may also extend below the gate 460, and forms a photosensitive charge accumulating region for collecting photo-generated electrons. The implant dose in the n– region 426 is within the range of approximately $5 \times 10^{11}$ to $1 \times 10^{14}$ atoms/cm$^2$, and preferably is within the range of approximately $1 \times 10^{12}$ to $5 \times 10^{13}$ atoms/cm$^2$.

Figure 5E:
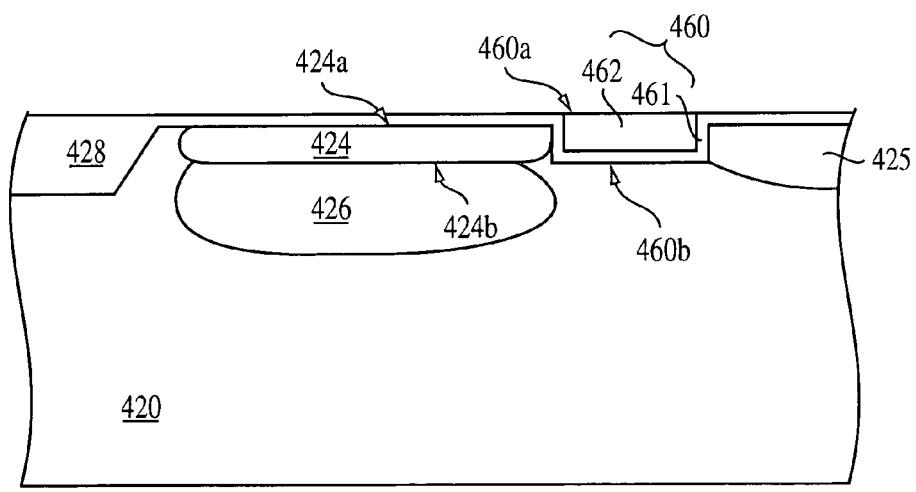
FIG. 5E is a diagrammatic side sectional view of the pixel cell of FIG. 4 at an intermediate stage of processing.

As illustrated in FIG. 5E, a doped surface layer 424 of a first conductivity type is formed over the n– region 426. Preferably, the doped surface layer 424 is a highly doped p+ surface layer 424. Preferably, the p+ surface layer 424 is substantially contained within a portion of the substrate 420 that is above the level of the bottom of the trench 435 (FIG. 5A). Therefore, a top surface 424a of the p+ surface layer 424 is approximately even with or below the level of a top surface 460a of the transfer gate 460; and a bottom surface 424b of the p+ surface layer 424 is approximately even with or above the level of a bottom surface 460b of the gate 460. Preferably, the p+ surface layer 424 is very shallow and has a thickness within the range of approximately 200 to 2000 Å. In a preferred arrangement, the p+ surface layer 424 may be less than approximately 800 Å thick. The p+ surface layer 424 is spaced away from the conductive layer 462 by at least the oxide layer 461. Preferably, the p+ surface layer 424 is spaced away from the conductive layer 462 by only the oxide layer 461.

Multiple techniques may be used to form the p+ surface layer 424, including, but not limited to, an ultra-shallow implant or solid-source doping techniques. For example, an ultra shallow implant of boron-11 may be conducted at an energy of approximately 500 eV to 30 keV. If $BF_2$ is used as a boron source, the implant is conducted at an energy of approximately 1 keV to 50 keV. Additionally, for example, plasma doping, or doping from a disposable film, such as a BSG film, may be used. Preferably, the implant dose of the p+ surface layer 424 is within the range of approximately $1 \times 10^{12}$ to $3 \times 10^{14}$ atoms/cm$^2$, and more specifically is approximately $5 \times 10^{12}$ to $5 \times 10^{13}$ atoms/cm$^2$. The p+ surface layer 424 may be formed using any p-type dopant such as boron, indium, or other suitable p-type ions.

Subsequently, the pixel cell 410 may be further processed to form other conventional features of a pixel cell.

Alternatively, it is possible to form the trench 435 and the transfer gate 460 subsequent to the formation of the photodiode 421 and floating diffusion regions 425. Also, the p+ surface layer 424 may be formed prior to the formation of the n− region region 426 and the floating diffusion region 425.

Figure 6:
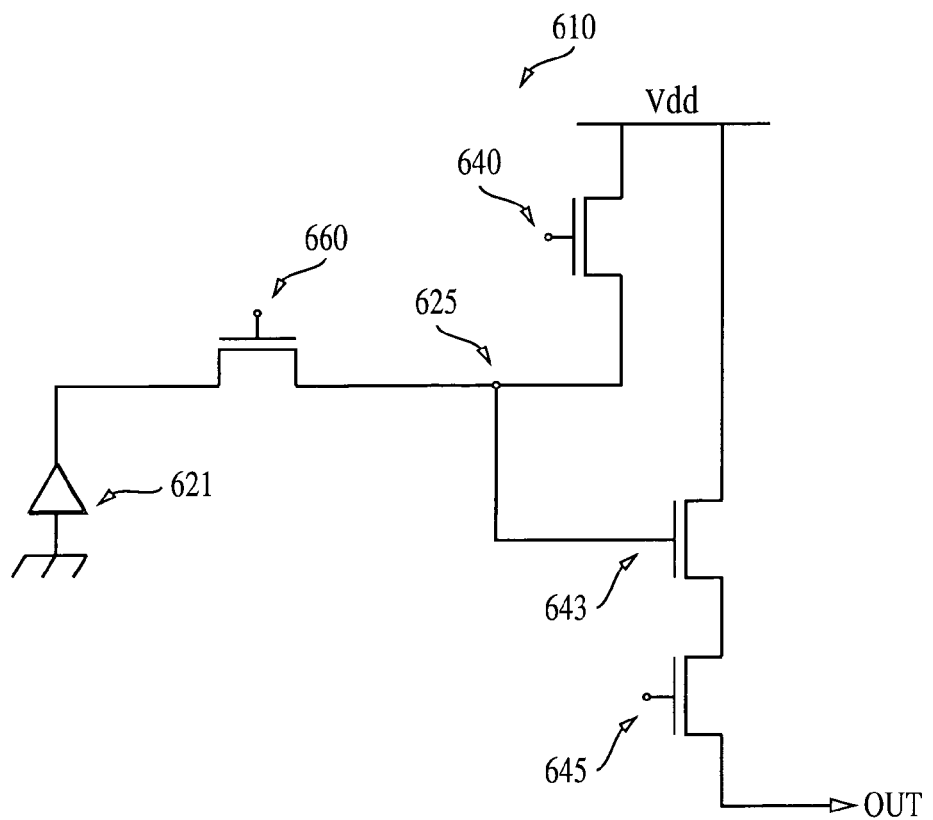
FIG. 6 is a schematic diagram of an exemplary pixel cell according to an embodiment of the invention.

A schematic diagram of an exemplary pixel cell 610 according to an embodiment of the invention is shown in FIG. 6. The CMOS pixel cell 610 is a four transistor (4T) cell. The CMOS pixel cell 610 comprises a photodiode 621, which is preferably a pinned photodiode (pinned photodiode), for collecting charges generated by light incident on the pixel, and a transfer gate 660 for transferring photoelectric charges from the pinned photodiode 621 to a sensing node, which is preferably a floating diffusion region 625. The transfer gate 660 is formed as described above in connection with FIGS. 5A–5E. Accordingly, the transfer gate 660 is at least partially below the surface of a substrate. The floating diffusion region 625 is electrically connected to the gate of an output source follower transistor 643. The pixel cell 610 also includes a reset transistor having a gate 640 for resetting the floating diffusion region 625 to a predetermined voltage before sensing a signal; a source follower transistor 643 which receives at its gate an electrical signal from the floating diffusion region 625; and a row select transistor 645 for outputting a signal from the source follower transistor 643 to an output terminal in response to an address signal.

The pixel cell 610 is formed as described above in connection with FIGS. 5A–5E. Accordingly, the pixel cell 610 provides improved charge transfer, image lag, fill factor, and quantum efficiency over a convention al pixel cell 10 (FIGS. 1 and 2).

While the above embodiments are described in connection with the formation of pnp-type photodiodes the invention is not limited to these embodiments. The invention also has applicability to other types of photodiodes and to photodiodes formed from npn regions in a substrate. If an npn-type photodiode is formed the dopant and conductivity types of all structures would change accordingly, with the transfer gate being part of a PMOS transistor, rather than an NMOS transistor as in the embodiments described above.

Figure 7:
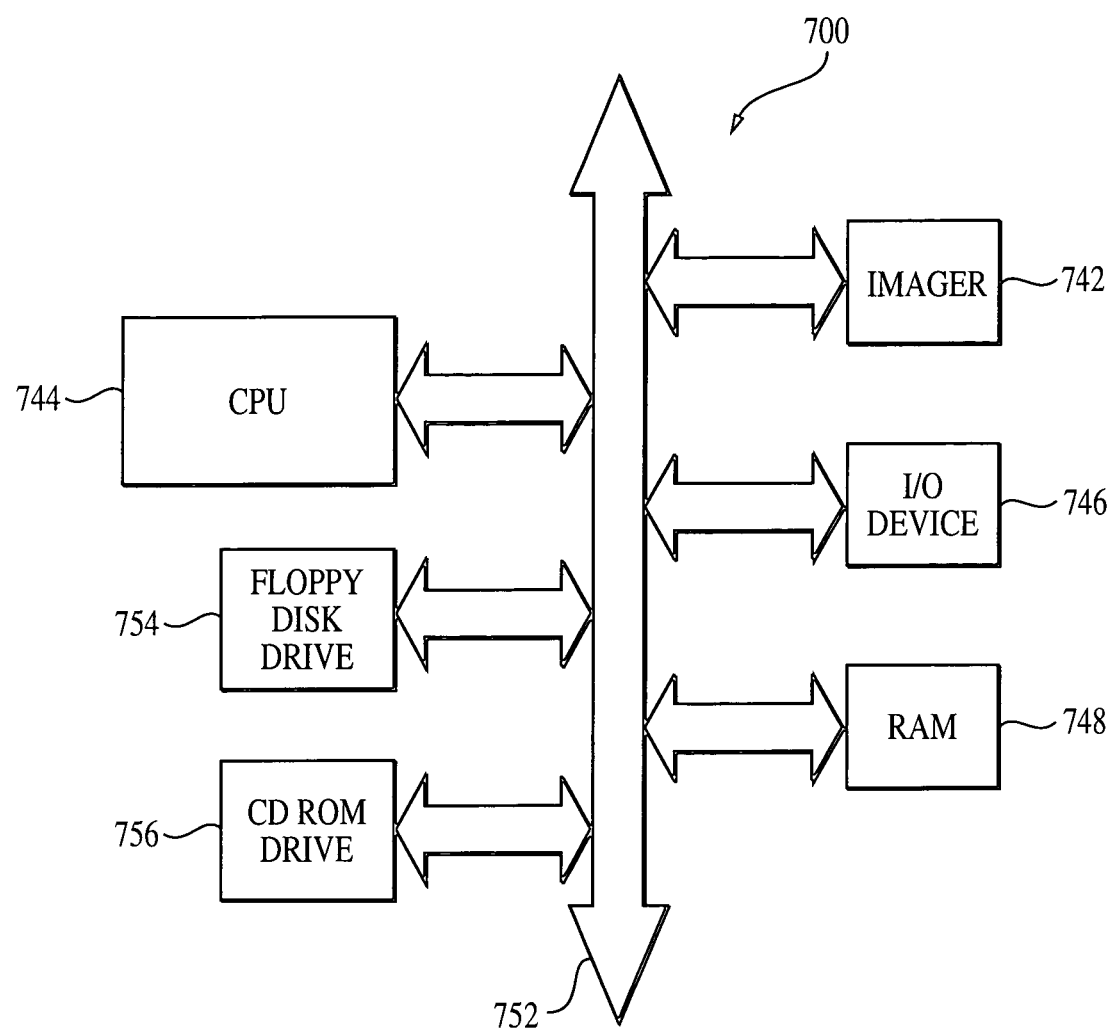
FIG. 7 illustrates a schematic diagram of a computer processor system incorporating a CMOS image sensor fabricated according to an embodiment of the present invention.

A typical processor-based system 700 including a CMOS imager device 742 having an array of pixels, which includes pixels according to the embodiments of the present invention, is illustrated generally in FIG. 7. A processor-based system 700 is exemplary of a system having digital circuits that could include CMOS imager devices. Without being limiting, such a system could include a computer system, camera system, scanner, machine vision, vehicle navigation, video phone, surveillance system, auto focus system, star tracker system, motion detection system, image stabilization system, and data compression system.

A processor-based system, for example a computer system, generally comprises a central processing unit (CPU) 744, such as a microprocessor, that communicates with an input/output (I/O) device 746 over a bus 752. The CMOS imager 742, which produces an image output from a pixel array, also communicates with the CPU 744 over bus 752. The processor-based system 700 also includes random access memory (RAM) 748, and may include peripheral devices, such as a floppy disk drive 754 and a compact disk (CD) ROM drive 756, which also communicate with CPU 744 over the bus 752. The CMOS imager 742 may be combined with a processor, such as a CPU, digital signal processor, or microprocessor, with or without memory storage on a single integrated circuit or on a different chip than the processor.

Although the invention is described in connection with a CMOS imager, the invention is also applicable to analogous structures of a Charge Coupled Device (CCD) imager. Specifically, for example, a gate according to an embodiment of the invention may be a gate of a CCD.

Instead of a four-transistor (4T) pixel cell described herein, the invention may also be incorporated into other pixel cell designs having different numbers of transistors. Without being limiting, such a design may include a three-transistor (3T) cell, a five-transistor (5T) cell, or a six-transistor (6T) cell. A 3T cell omits the transfer transistor, but may have a reset transistor adjacent to a photodiode. A 5T cell differs from the 4T cell by the addition of a transistor, such as a shutter transistor or a CMOS photogate transistor, and a 6T cell further includes another transistor, such as an anti-blooming transistor.

Further, although embodiments of the invention are described in relation to a transfer gate, the invention is not so limited. The invention is also applicable to other gates of other devices in pixel cells. For example, and without being limiting, a reset transistor or, as noted above, a CCD may have a gate formed as described above in connection with FIGS. 4–5E.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

The invention claimed is:

1. A pixel cell comprising:
    a substrate;
    a gate of a transistor formed at least partially below a surface of the substrate, the gate having a bottom surface below the surface of the substrate;
    a channel region of the transistor located below the bottom surface of the gate; and
    a photo-conversion device formed adjacent to the gate, the photo-conversion device comprising a doped surface layer of a first conductivity type, and a doped region of a second conductivity type underlying the doped surface layer, wherein the doped surface layer is at a level approximately between a level of a top surface of the gate and a level of the bottom surface of the gate, and wherein the second conductivity type layer is at a level below the level of the bottom surface of the gate.

2. The pixel cell of claim 1, wherein the first and second conductivity types are p and n respectively.

3. The pixel cell of claim 1, wherein the photo-conversion device is a pinned photodiode.

4. The pixel cell of claim 1, wherein the gate is the gate of a transfer transistor.

5. The pixel cell of claim 1, wherein the gate is the gate of a reset transistor.

6. The pixel cell of claim 1, wherein the gate is the gate of a charge coupled device.

7. The pixel cell of claim 1, further comprising a sensing node adjacent to the gate and on an opposite side of the gate from the photo-conversion device.

8. The pixel cell of claim 7, wherein the sensing node is a floating diffusion region.

9. The pixel cell of claim 1, wherein the doped surface layer has a thickness within the range of approximately 200 to approximately 2000 Å.

10. The pixel cell of claim 1, wherein the implant dose of a dopant for the doped surface layer is within the range of approximately $1 \times 10^{12}$ to approximately $3 \times 10^{14}$ atoms per $cm^2$.

11. The pixel cell of claim 1, further comprising a trench in the substrate, wherein the gate is at least partially in the trench.

12. The pixel cell of claim 11, wherein the trench has a depth within the range of approximately 500 to approximately 2500 Å.

13. The pixel cell of claim 1, wherein the gate comprises:
a conductive layer; and
insulating material, wherein the insulating material is on at least two lateral sides of the conductive layer.

14. The pixel cell of claim 13, wherein the insulating material on the two lateral sides of the gate has a thickness within the range of approximately 20 to approximately 100 Å thick.

15. The pixel cell of claim 13, wherein the doped surface layer is in contact with the insulating material.

16. The pixel cell of claim 1, wherein operation of the gate affects the doped surface layer at least partially through a sidewall of the gate.

17. The pixel cell of claim 1, wherein the gate is part of a CMOS imager.

18. The pixel cell of claim 1, wherein the gate is part of a charge coupled device imager.

19. A pixel cell comprising:
a substrate;
a trench in the substrate;
a gate of a transistor at least partially in the trench;
a channel region of the transistor formed below the trench;
a photo-conversion device formed adjacent to the trench, the photo-conversion device comprising a doped surface layer of a first conductivity type below the surface of the substrate, and a doped region of a second conductivity type underlying the doped surface layer of a first conductivity type, wherein the doped surface layer is at least partially above a level of a bottom surface of the trench, wherein the doped surface layer is at a level approximately between a level of a top surface of the gate and a level of the bottom surface of the gate, and wherein the second conductivity type layer is at a level below the level of the bottom surface of the gate.

20. The pixel cell of claim 19, wherein the trench has a depth within the range of approximately 500 to approximately 2500 Å.

21. The pixel cell of claim 19, wherein the gate comprises:
a conductive layer; and
insulating material, wherein the insulating material is on at least two lateral sides of the conductive layer.

22. The pixel cell of claim 21, wherein the insulating material on the two lateral sides of the gate has a thickness within the range of approximately 20 to approximately 100 Å thick.

23. An imager system, comprising:
a processor; and
an imager coupled to the processor, the imager comprising:
a substrate;
a pixel formed over the substrate, the pixel comprising:
a gate of a transistor formed at least partially below a surface of the substrate, the gate having a bottom surface below the surface of the substrate;
a channel region of the transistor located below the bottom surface of the gate; and
a photo-conversion device formed adjacent to the gate, the photo-conversion device comprising a doped surface layer of a first conductivity type, and a doped region of a second conductivity type underlying the doped surface layer, wherein the doped surface layer is at least partially above a level of a bottom surface of the gate wherein the doped surface layer is at a level approximately between a level of a top surface of the gate and a level of the bottom surface of the gate, and wherein the second conductivity type layer is at a level below the level of the bottom surface of the gate.

24. The system of claim 23, wherein the imager is a CMOS imager.

25. The system of claim 23, wherein the imager is a charge coupled device imager.

26. The system of claim 23, wherein the first and second conductivity types are p and n respectively.

27. The system of claim 23, wherein the photo-conversion device is a pinned photodiode.

28. The system of claim 23, wherein the gate is the gate of a transfer transistor.

29. The system of claim 23, wherein the gate is a transfer gate of a charge coupled device.

30. The system of claim 23, further comprising a sensing node adjacent to the gate and on an opposite side of the gate from the photo-conversion device.

31. The system of claim 23, wherein the sensing node is a floating diffusion region.

32. The system of claim 23, wherein the doped surface layer has a thickness within the range of approximately 200 to approximately 2000 Å.

33. The system of claim 23, further comprising a trench formed in the substrate, wherein the gate is at least partially in the trench.

34. The system of claim 33, wherein the trench has a depth within the range of approximately 500 to approximately 2500 Å.

35. The system of claim 23, wherein operation of the gate affects the doped surface layer at least partially through a sidewall of the gate.

36. A pixel cell comprising:
a substrate;
a trench in the substrate;

a gate of a transistor formed in the trench and contained within the lateral boundaries of the trench, the gate having a bottom surface below the surface of the substrate;

a channel region of the transistor located below the bottom surface of the gate; and a photo-conversion device formed adjacent to the gate, the photo-conversion device comprising a doped surface layer of a first conductivity type, and a doped region of a second conductivity type underlying the doped surface layer, wherein the doped surface layer is at least partially above a level of a bottom surface of the gate and wherein the second conductivity type layer is at a level below the level of the bottom surface of the gate.

37. The pixel cell of claim 36, wherein the photo-conversion device is a pinned photodiode.

38. The pixel cell of claim 36, wherein the gate is the gate of a transfer transistor.

39. The pixel cell of claim 36, wherein the gate is the gate of a reset transistor.

40. The pixel cell of claim 36, further comprising a sensing node adjacent to the gate and on an opposite side of the gate from the photo-conversion device.

41. The pixel cell of claim 36, wherein the doped surface layer is at a level approximately between a level of a top surface of the gate and a level of the bottom surface of the gate.

42. The pixel cell of claim 36, wherein the trench has a depth within the range of approximately 500 to approximately 2500 Å.

* * * * *

UNITED STATES PATENT AND TRADEMARK OFFICE
CERTIFICATE OF CORRECTION

PATENT NO. : 7,187,018 B2 Page 1 of 1
APPLICATION NO. : 10/602721
DATED : March 6, 2007
INVENTOR(S) : Chandra Mouli et al.

It is certified that error appears in the above-identified patent and that said Letters Patent is hereby corrected as shown below:

In the Specification, the following error is corrected:

Column 2, line 1, "filly" should read --fully--.

In the Claims, the following error is corrected:

Claim 31, column 10, line 50, "claim 23" should read --claim 30--.

Signed and Sealed this

Twenty-sixth Day of February, 2008

JON W. DUDAS
*Director of the United States Patent and Trademark Office*